United States Patent
Kikushima et al.

(10) Patent No.: US 9,337,801 B2
(45) Date of Patent: *May 10, 2016

(54) VIBRATION ELEMENT, VIBRATOR, OSCILLATOR, ELECTRONIC APPARATUS, AND MOVING OBJECT

(71) Applicant: Seiko Epson Corporation, Tokyo (JP)

(72) Inventors: Masayuki Kikushima, Ina (JP); Masako Tanaka, Okaya (JP); Naohisa Obata, Minowa (JP); Yukihiro Unno, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/227,332

(22) Filed: Mar. 27, 2014

(65) Prior Publication Data

US 2014/0292436 A1    Oct. 2, 2014

(30) Foreign Application Priority Data

Mar. 29, 2013  (JP) .................................. 2013-075013

(51) Int. Cl.
*H03B 5/32* (2006.01)
*H03H 9/05* (2006.01)
*H03H 9/17* (2006.01)
*H01L 41/053* (2006.01)
*H01L 41/09* (2006.01)
*H03H 9/10* (2006.01)

(52) U.S. Cl.
CPC ........... *H03H 9/172* (2013.01); *H01L 41/0913* (2013.01); *H03H 9/0538* (2013.01); *H03B 5/32* (2013.01); *H03H 9/0547* (2013.01); *H03H 9/1021* (2013.01)

(58) Field of Classification Search
CPC . H01L 41/053; H01L 41/083; H01L 41/0906; H01L 41/0913; H01L 41/0993; H03B 5/30; H03B 5/32; H03G 9/0538; H03G 9/17; H03G 9/172; H03G 9/21; H03G 9/2468
USPC .......... 310/311, 348, 368, 370; 331/154, 156, 331/158
See application file for complete search history.

(56) References Cited

U.S. PATENT DOCUMENTS

| | | | |
|---|---|---|---|
| 5,307,034 A * | 4/1994 | Morita et al. | 333/187 |
| 7,098,574 B2 | 8/2006 | Iwata | |
| 7,861,389 B2 * | 1/2011 | Naito et al. | 29/25.35 |
| 8,026,652 B2 | 9/2011 | Yasuike | |

(Continued)

FOREIGN PATENT DOCUMENTS

| | | |
|---|---|---|
| JP | 2001-144578 A | 5/2001 |
| JP | 2002-033640 A | 1/2002 |
| JP | 2002-198772 A | 7/2002 |
| JP | 2003-264446 A | 9/2003 |
| JP | 2004-165743 A | 6/2004 |
| JP | 2006-203700 A | 8/2006 |

(Continued)

*Primary Examiner* — Levi Gannon
(74) *Attorney, Agent, or Firm* — Harness, Dickey & Pierce, P.L.C.

(57) ABSTRACT

A vibration element includes a piezoelectric substrate including a vibrating section and a thick section having a thickness larger than that of the vibrating section. The thick section includes a first thick section provided along a first outer edge of the vibrating section, a second thick section provided along a second outer edge thereof, and a third thick section provided along a third outer edge thereof. When a maximum size of the second thick section in the vibration direction is Lmax and a minimum size thereof is Lmin, an average size expressed by (Lmax+Lmin)/2 is 100 μm or smaller.

14 Claims, 17 Drawing Sheets

(56) References Cited

U.S. PATENT DOCUMENTS

| | | | |
|---|---|---|---|
| 2012/0133248 A1* | 5/2012 | Kusano | 310/348 |
| 2012/0306321 A1* | 12/2012 | Ishii | 310/348 |
| 2013/0043959 A1 | 2/2013 | Ishii | |
| 2013/0043960 A1* | 2/2013 | Ishii et al. | 331/158 |
| 2014/0203689 A1 | 7/2014 | Obata | |
| 2014/0253253 A1* | 9/2014 | Kikushima et al. | 331/156 |
| 2014/0292437 A1* | 10/2014 | Tanaka et al. | 331/158 |

FOREIGN PATENT DOCUMENTS

| | | |
|---|---|---|
| JP | 2009-164824 A | 7/2009 |
| JP | 2012-253630 A | 12/2012 |
| JP | 2013-042410 A | 2/2013 |
| JP | 2013-042440 A | 2/2013 |
| JP | 2013-046189 A | 3/2013 |
| JP | 2014-138413 A | 7/2014 |

* cited by examiner

VIBRATION ELEMENT, VIBRATOR, OSCILLATOR, ELECTRONIC APPARATUS, AND MOVING OBJECT

BACKGROUND

1. Technical Field

The present invention relates to a vibration element, a vibrator, an oscillator, an electronic apparatus and a moving object.

2. Related Art

An AT-cut quartz crystal vibration element shows a thickness shear vibration in a vibration mode of a main vibration for excitation. Since the AT-cut quartz crystal vibration element is suitable for reduction in size and increase in frequency and provides a cubic curve having an excellent frequency-temperature characteristic, the AT-cut quartz crystal vibration element is used in various apparatuses such as a piezoelectric oscillator and an electronic apparatus.

JP-A-2002-198772 discloses an AT-cut quartz crystal vibration element having an inverted mesa structure that includes a thin vibrating section and a thick section provided around the entire periphery of the vibrating section. The AT-cut quartz crystal vibration element is fixed to a package through an adhesive agent in one end portion of the thick section. In a state where the AT-cut quartz crystal vibration element is cantilevered, if an acceleration in a thickness direction is applied to the AT-cut quartz crystal vibration element, a tip section (the vibrating section) is deformed, which causes a problem in that a vibration characteristic (frequency characteristic) is not stable. In particular, in the AT-cut quartz crystal vibration element disclosed in JP-A-2002-198772, since the thick section is formed over the entire periphery of the vibrating section and the weight of the tip section is heavy, the influence on the acceleration is large, and accordingly, the amount of frequency deviation is also increased.

SUMMARY

An advantage of some aspects of the invention is to provide a vibration element, a vibrator, an oscillator, an electronic apparatus and a moving object capable of reducing change in a vibration characteristic due to an external force such as an acceleration (vibration) while suppressing increase in size (increase in thickness) to achieve a stable vibration characteristic.

The invention can be implemented as the following application examples.

Application Example 1

This application example is directed to a vibration element including: a substrate that includes a first region having a vibration region that vibrates with a thickness shear vibration, and a second region that is integrated with the first region and has a thickness larger than that of the first region; and excitation electrodes that are respectively provided on front and rear surfaces of the vibration region, in which the first region includes a first outer edge and a second outer edge that are respectively provided on one side and the other side in a vibration direction of the thickness shear vibration and extend in a direction that intersects with the vibration direction, and a third outer edge and a fourth outer edge that are respectively provided on one side and the other side in the direction that intersects with the vibration direction, the fourth outer edge being exposed in a cross-sectional view of the substrate, in which the second region includes a first thick section that is provided along the first outer edge and is provided with a fixing section to be fixed to a target, a second thick section that is provided along the second outer edge and a third thick section that is provided along the third outer edge and connects the first thick section and the second thick section, and in which when a maximum size of the second thick section along the vibration direction is Lmax and a minimum size thereof is Lmin, an average size expressed by (Lmax+Lmin)/2 is 100 μm or smaller.

With this configuration, it is possible to obtain a vibration element capable of reducing the mass of the tip side (side opposite to the fixing section), suppressing change in a vibration characteristic due to an external force such as an acceleration (vibration) and achieving a stable vibration characteristic.

Application Example 2

In the vibration element according to this application example, it is preferable that, when the maximum size of the second thick section along the vibration direction is Lmax and the minimum size thereof is Lmin, the average size expressed by (Lmax+Lmin)/2 be 40 μm or greater.

With this configuration, it is possible to prevent excessive reduction in rigidity of the vibration element.

Application Example 3

In the vibration element according to this application example, it is preferable that, when a maximum thickness of the second region is Tmax and a minimum thickness thereof is Tmin, an average thickness expressed by (Tmax+Tmin)/2 be 50 μm or greater and 70 μm or smaller.

With this configuration, it is possible to form the first region with accuracy while increasing the rigidity of the vibration element.

Application Example 4

In the vibration element according to this application example, it is preferable that, when a maximum size of the third thick section along the direction that intersects with the vibration direction is Lmax and a minimum size thereof is Lmin, an average size expressed by (Lmax+Lmin)/2 be 200 μm or greater.

With this configuration, it is possible to sufficiently increase the rigidity of the vibration element.

Application Example 5

In the vibration element according to this application example, it is preferable that, when an electrical axis, a mechanical axis and an optical axis that are crystal axes of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate be a quartz crystal plate in which a surface including the X axis and the Z' axis corresponds to a main surface and a direction of the Y' axis corresponds to a thickness.

With this configuration, it is possible to obtain a vibration element having an excellent temperature characteristic.

Application Example 6

This application example is directed to a vibrator including the above vibration element and a package in which the vibration element is accommodated.

With this configuration, it is possible to obtain a vibrator with high reliability.

Application Example 7

This application example is directed to an oscillator including the above vibration element and an oscillation circuit that drives the vibration element.

With this configuration, it is possible to obtain an oscillator with high reliability.

Application Example 8

This application example is directed to an electronic apparatus including the above vibration element.

With this configuration, it is possible to obtain an electronic apparatus with high reliability.

Application Example 9

This application example is directed to a moving object including the above vibration element.

With this configuration, it is possible to obtain a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibration element, a vibrator, an oscillator, an electronic apparatus and a moving object according to the invention will be described in detail with reference to preferable embodiments shown in the accompanying drawings.

1. Vibration Element

First, the vibration element of the invention will be described.

First Embodiment

Figure 1:
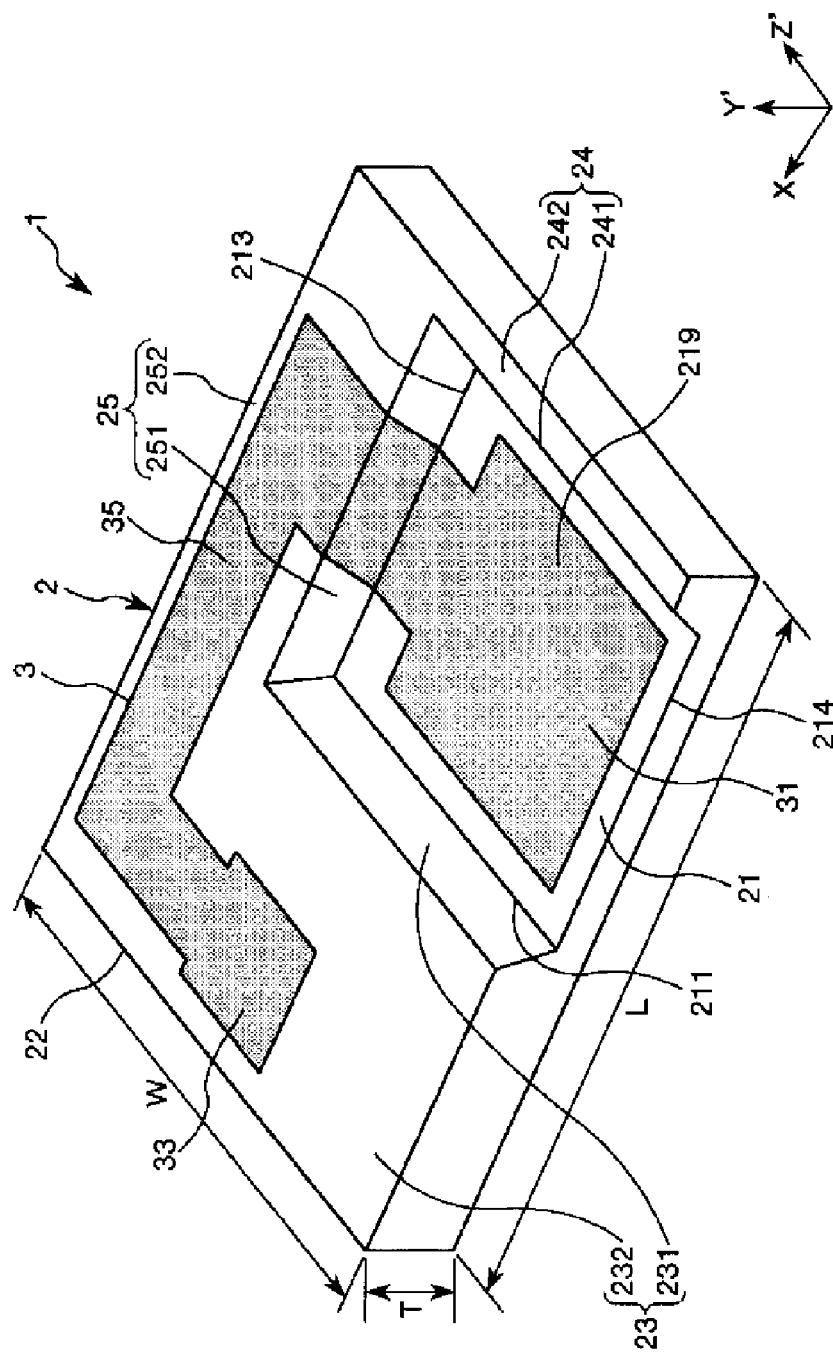
FIG. 1 is a perspective view illustrating a vibration element according to a first embodiment of the invention.
Figure 2:
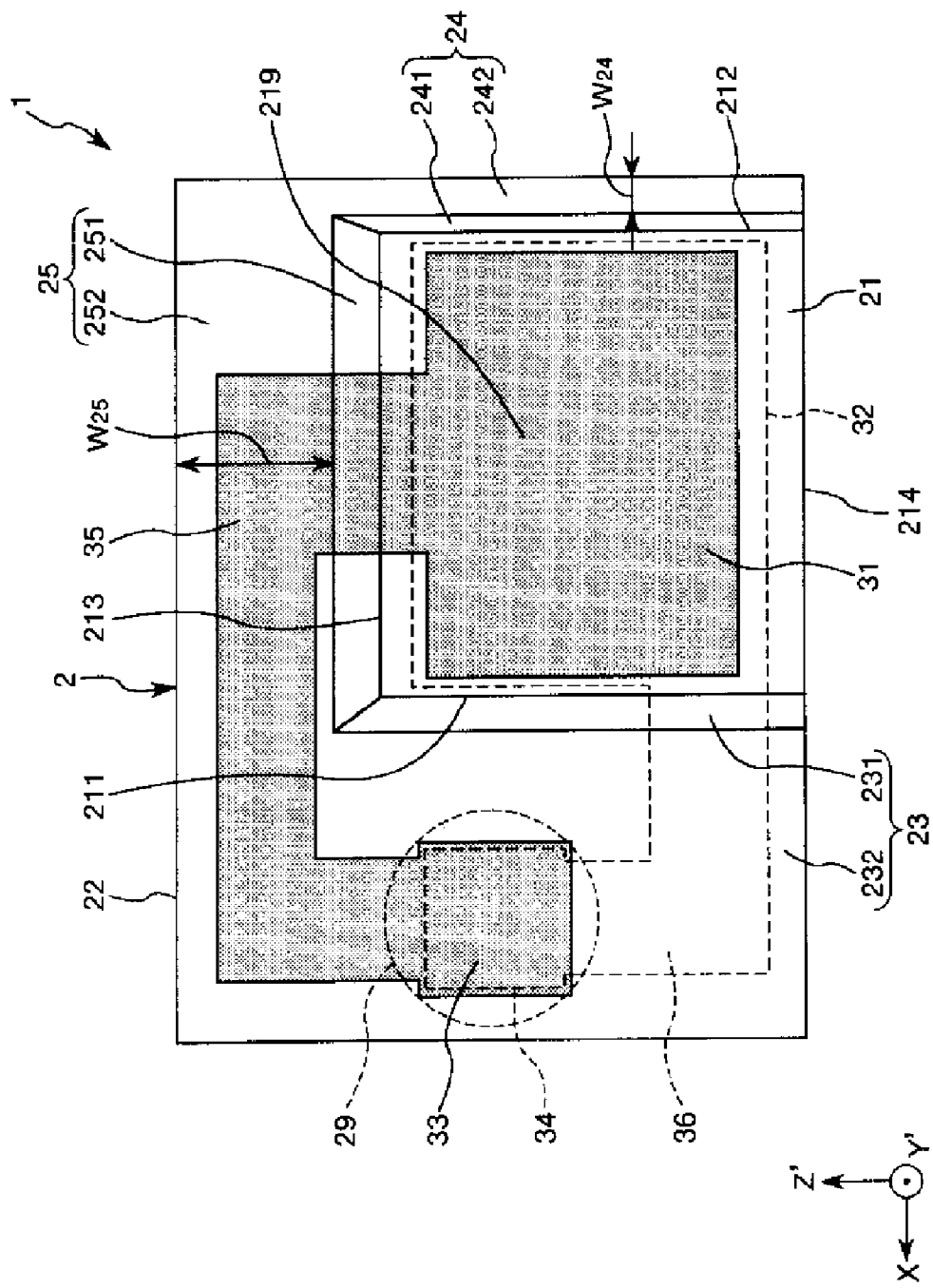
FIG. 2 is a plan view illustrating the vibration element shown in FIG. 1.
Figure 3:
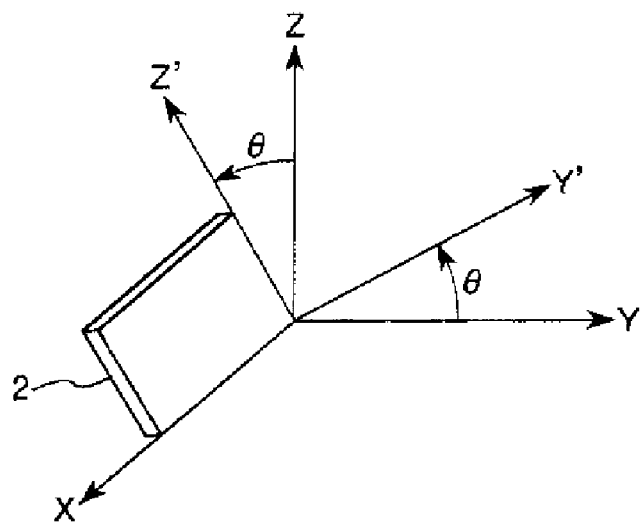
FIG. 3 is a diagram illustrating the relationship between an AT-cut quartz crystal substrate and a crystal axis of a quartz crystal.
Figure 4:
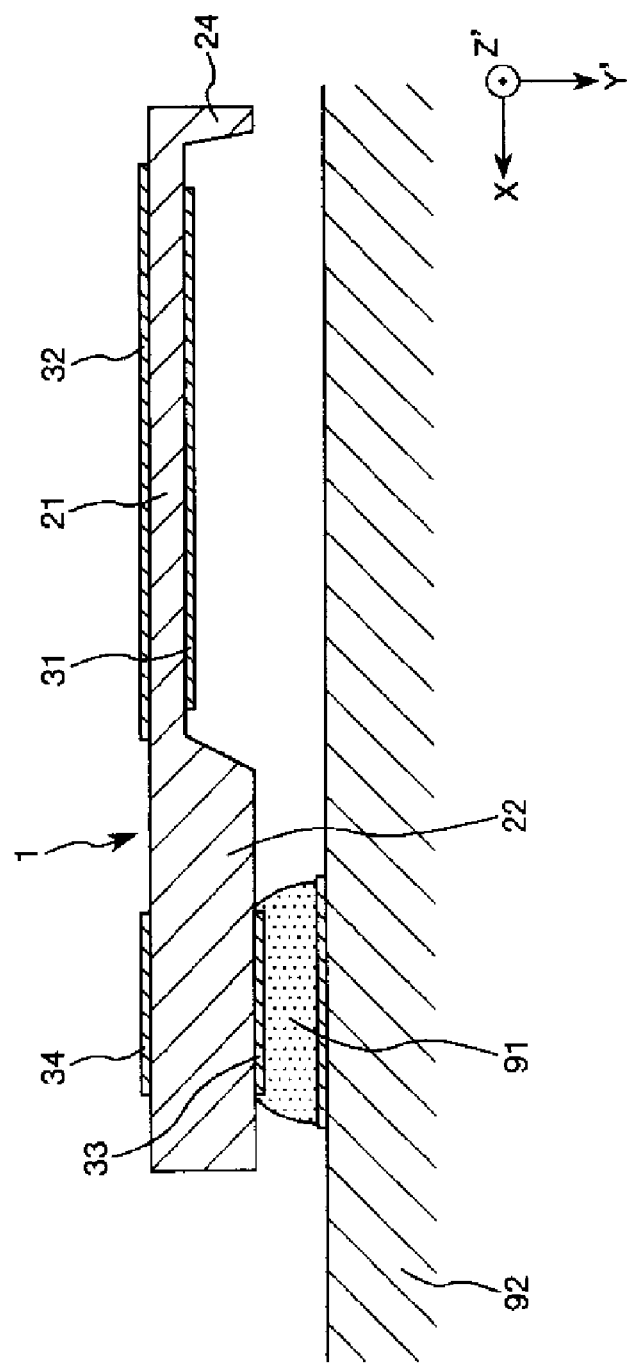
FIG. 4 is a side view illustrating a state where the vibration element shown in FIG. 1 is fixed to a target.
Figure 5:
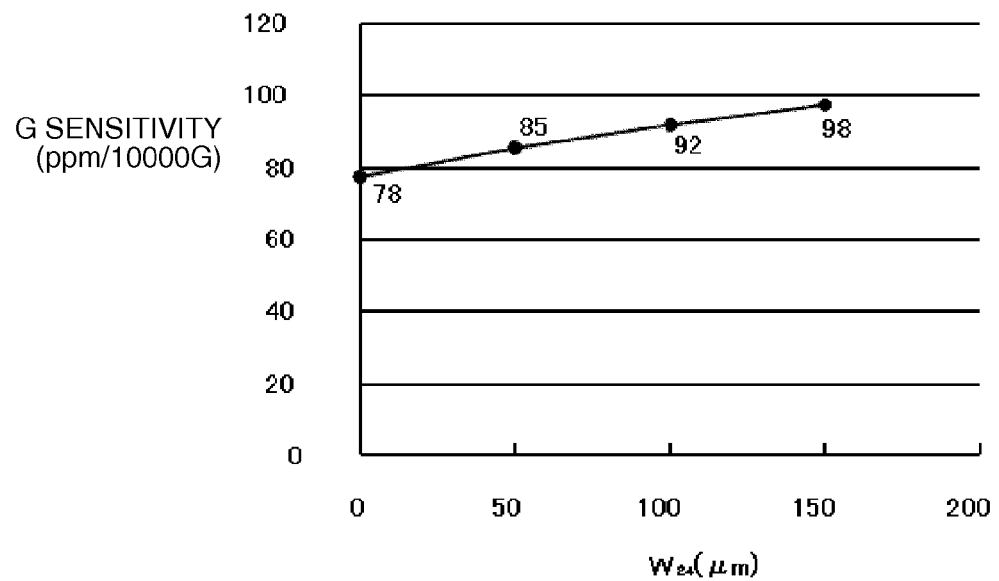
FIG. 5 is a graph illustrating the relationship between the width of a second thick section and G sensitivity.
Figure 6:
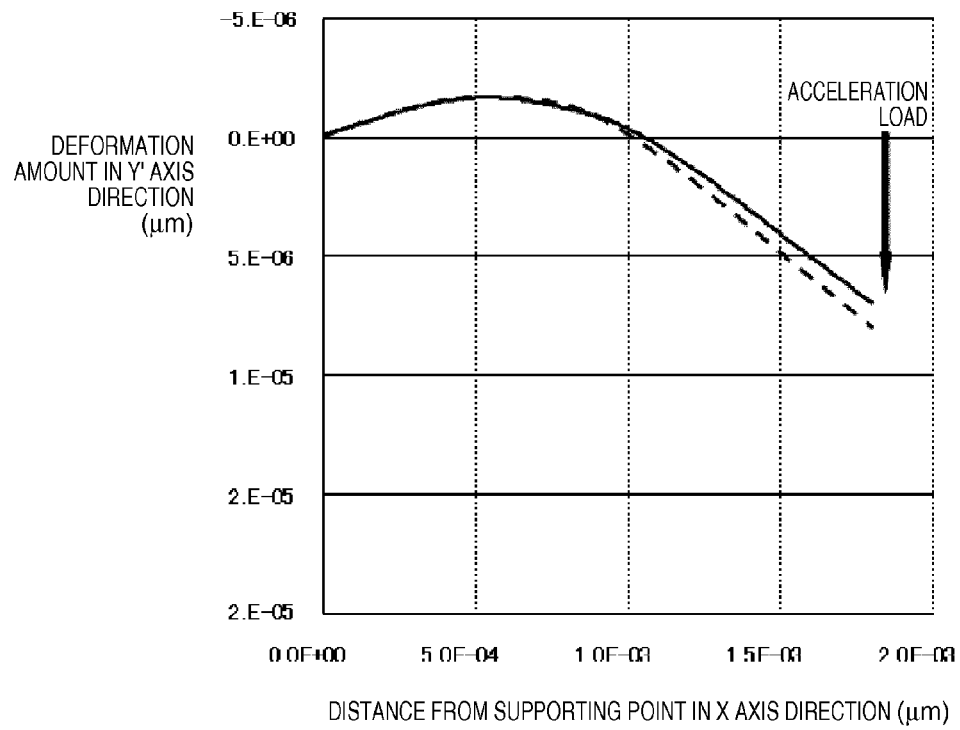
FIG. 6 is a graph illustrating the relationship between the width of the second thick section and the amount of deformation.
Figure 7:
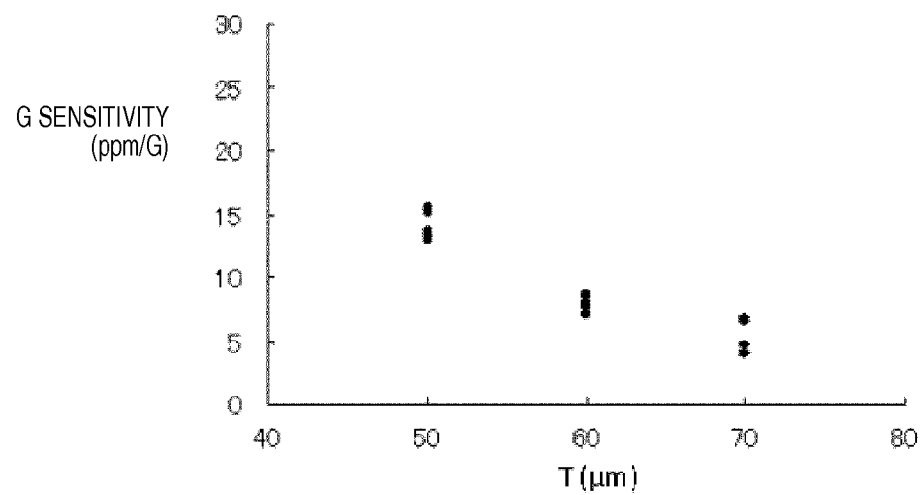
FIG. 7 is graph illustrating the relationship between the thickness of a thick section and G sensitivity.
Figure 8:
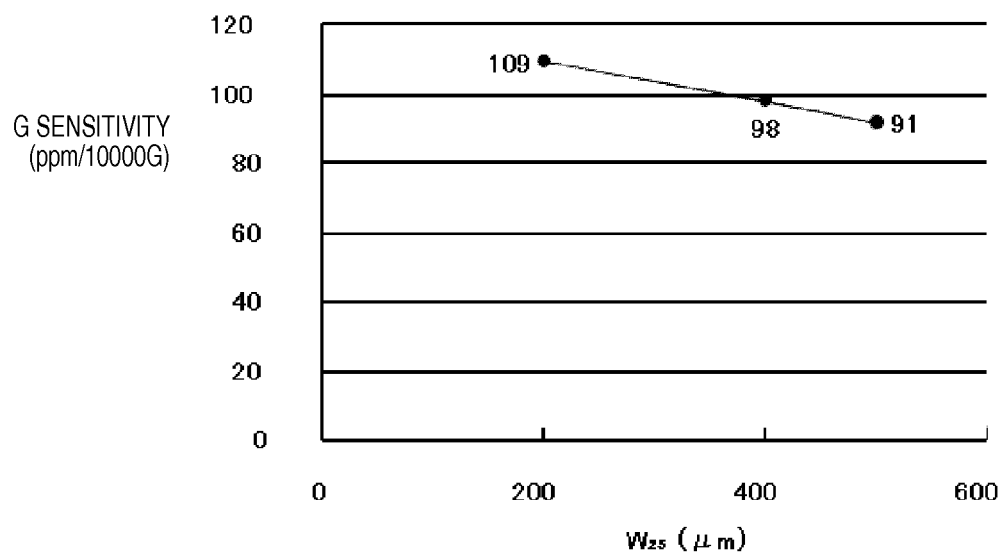
FIG. 8 is a graph illustrating the relationship between the width of a third thick section and G sensitivity.
Figure 10:
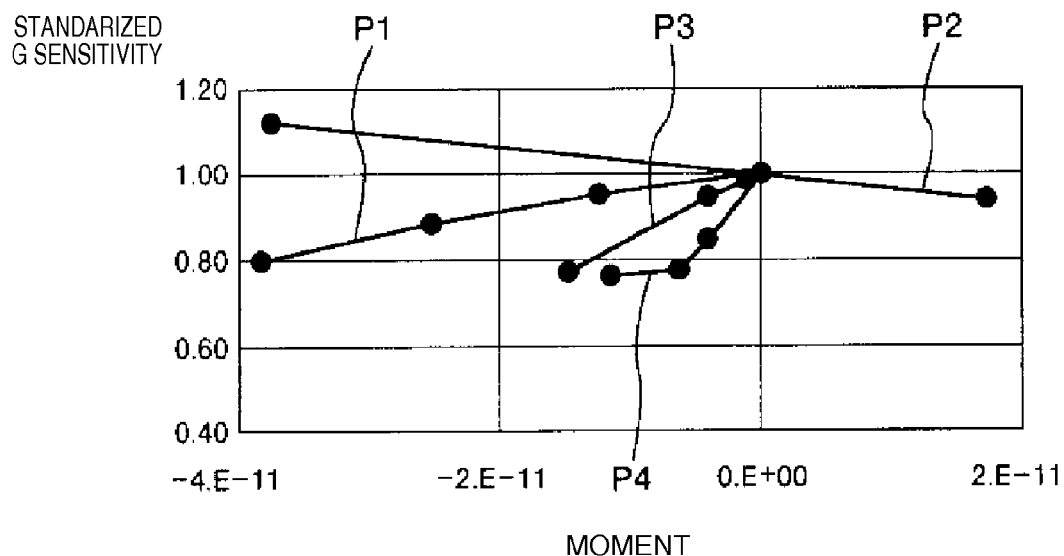
FIG. 10 is a graph illustrating the relationship between the moment of a removed section of each pattern shown in FIGS. 9A to 9E and G sensitivity.
Figure 11:
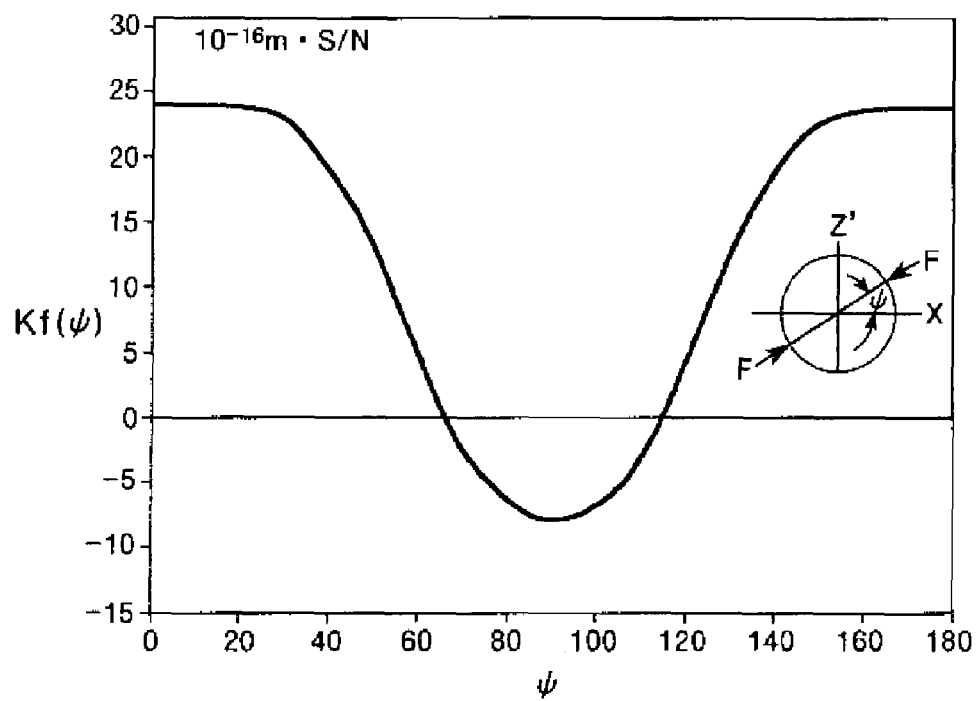
FIG. 11 is a graph illustrating the relationship between a crystal axis of a quartz crystal and stress sensitivity.

FIG. 1 is a perspective view illustrating a vibration element according to a first embodiment of the invention. FIG. 2 is a plan view illustrating the vibration element shown in FIG. 1. FIG. 3 is a diagram illustrating the relationship between an AT-cut quartz crystal substrate and a crystal axis of a quartz crystal. FIG. 4 is a side view illustrating a state where the vibration element shown in FIG. 1 is fixed to a target. FIG. 5 is a graph illustrating the relationship between the width of a second thick section and G sensitivity. FIG. 6 is a graph illustrating the relationship between the width of the second thick section and the amount of deformation. FIG. 7 is graph illustrating the relationship between the thickness of a thick section and G sensitivity. FIG. 8 is a graph illustrating the relationship between the width of a third thick section and G sensitivity. FIGS. 9A to 9E are diagrams illustrating patterns for reducing the mass of a tip section of the vibration element. FIG. 10 is a graph illustrating the relationship between the moment of a removed section of each pattern shown in FIGS. 9A to 9E and G sensitivity. FIG. 11 is a graph illustrating the relationship between a crystal axis of a quartz crystal and stress sensitivity. Hereinafter, for ease of description, a right side in FIG. 2 is referred to as a tip, and a left side therein is referred to as a base end.

As shown in FIGS. 1 and 2, a vibration element 1 includes a piezoelectric substrate (substrate) 2, and an electrode 3 formed on the piezoelectric substrate 2.

Piezoelectric Substrate

The piezoelectric substrate 2 is a plate-like quartz crystal substrate. Here, a quartz crystal that is a material of the piezoelectric substrate 2 belongs to a trigonal system, and has crystal axes X, Y and Z that are orthogonal to each other, as shown in FIG. 3. The X axis, Y axis and Z axis are referred to as an electrical axis, a mechanical axis, and an optical axis, respectively. The piezoelectric substrate 2 of the present embodiment is a "rotated Y-cut quartz crystal substrate" cut along a plane obtained by rotating an XZ plane around the X axis by a predetermined angle θ, in which a substrate cut along a plane obtained by a rotation of θ=35° 15', for example, is referred to as an "AT-cut quartz crystal substrate". By using such a quartz crystal substrate, the vibration element 1 having an excellent temperature characteristic is achieved. Here, as the piezoelectric substrate 2, instead of the AT-cut piezoelectric substrate, any substrate that can excite a thickness shear vibration, for example, a BT-cut piezoelectric substrate may be used.

Hereinafter, the Y axis and the Z axis rotated around the X axis corresponding to the angle θ are set as a Y' axis and a Z' axis. That is, the piezoelectric substrate 2 has a thickness in the Y' axis direction, and has an area in an XZ' plane direction.

The piezoelectric substrate 2 forms an approximately rectangular shape in which a direction along the X axis corresponds to long sides and a direction along the Z' axis corresponds to short sides in a plan view. Further, in the piezoelectric substrate 2, the −X axis direction corresponds to the tip side, and the +X axis direction corresponds to the base end side.

As shown in FIGS. 1 and 2, the piezoelectric substrate 2 includes a vibrating section (a first region) 21 having a thin vibration region (a region where vibration energy is confined) 219, and a thick section (a second region) 22 that is integrated with the vibrating section 21 and has a thickness larger than that of the vibration region 219. The vibrating section 21 may be formed by forming a recessed section by wet etching on a main surface of the quartz crystal substrate on a +Y axis side, for example.

As shown in FIGS. 1 and 2, the vibrating section 21 is shifted in the −X axis direction and the −Z' axis direction with reference to the center of the piezoelectric substrate 2, of which a part of an outer edge is exposed from the thick section 22. Specifically, the vibrating section 21 includes a first outer edge 211 and a second outer edge 212 that are separated in the X axis direction (a movement direction of the thickness shear vibration) and extend in the Z' axis direction (a direction intersecting with the X axis direction) in the plan view of the vibration element 1; and a third outer edge 213 and a fourth outer edge 214 that are separated in the Z' axis direction and extend in the X axis direction. Among the first and second outer edges 211 and 212, the first outer edge 211 is positioned on the +X axis side, and the second outer edge 212 is positioned on the −X axis side. Further, among the third and fourth outer edges 213 and 214, the third outer edge 213 is positioned on the +Z' axis side, and the fourth outer edge 214 is positioned on the −Z' axis side.

The thick section 22 is provided to surround three sides of the vibrating section 21. As shown in FIG. 1, a front surface (main surface on the +Y' axis direction side) of the thick section 22 is provided to protrude toward the +Y' axis direction side from a front surface (main surface on the +Y' axis direction side) of the vibrating section 21. On the other hand, a rear surface (main surface on the −Y' axis direction side) of the thick section 22 is provided on the same plane as a rear surface (main surface on the −Y' axis direction side) of the vibrating section 21.

As shown in FIGS. 1 and 2, the thick section 22 includes a first thick section 23 disposed along the first outer edge 211, a second thick section 24 disposed along the second outer edge 212, and a third thick section 25 that is disposed along the third outer edge 213 and is connected to the first and second thick sections 23 and 24. Accordingly, the thick section 22 forms a structure curved along the vibrating section 21 in the plan view. On the other hand, the thick section 22 is not formed at the fourth outer edge 214 of the vibrating section 21, and the fourth outer edge 214 is exposed from the thick section 22. In this way, by partially providing the thick section 22 along the outer edge of the vibrating section 21 except for the fourth outer edge 214, it is possible to reduce the mass of the vibration element 1 on the tip side while securing rigidity of the vibration element 1 (vibrating section 21). Further, it is possible to achieve reduction in the size of the vibration element 1.

Here, by providing the third thick section 25 on the +Z' axis side with respect to the vibrating section 21, it is possible to shorten the width (length in the Z' axis direction) of an inclined section 251 (to be described later), compared with the case where the third thick section 25 is provided on the −Z axis side. Thus, according to the thick section 22 having such a configuration, it is possible to achieve reduction in the size of the vibration element 1.

The first thick section 23 includes an inclined section (residual section) 231 that is connected to the first outer edge 211 and has a thickness gradually increasing in the +X axis direction, and a thick section main body 232 that is connected to an end edge of the inclined section 231 on the +X axis direction side and has an approximately uniform thickness. Similarly, the second thick section 24 includes an inclined section (residual section) 241 that is connected to the second outer edge 212 and has a thickness gradually increasing in the −X axis direction, and a thick section main body 242 that is connected to an end edge of the inclined section 241 on the −X axis direction side and has an approximately uniform thickness. Similarly, the third thick section 25 includes the inclined section (residual section) 251 that is connected to the third outer edge 213 and has a thickness gradually increasing in the +Z' axis direction, and a thick section main body 252 that is connected to an end edge of the inclined section 251 on the +Z' axis direction side and has an approximately uniform thickness.

On the front surface of the thick section main body 232 of the first thick section 23, that is, on the base end side of the vibration element 1, a mounting section (fixing section) 29 is provided. As shown in FIG. 4, the vibration element 1 is fixed to a target 92 using an adhesive material 91 through the mounting section 29. The position of the mounting section 29 is not particularly limited, and for example, the mounting section 29 may be provided on the rear surface of the thick section main body 232.

Electrode

The electrode 3 includes a pair of excitation electrodes 31 and 32, a pair of pad electrodes 33 and 34, and a pair of extraction electrodes 35 and 36. The excitation electrode 31 is formed on the front surface of the vibration region 219. On the other hand, the excitation electrode 32 is formed to be opposite to the excitation electrode 31 on the rear surface of the vibration region 219. The excitation electrodes 31 and 32 form an approximately rectangular shape in which the X axis direction corresponds to long sides and the Z' axis direction corresponds to short sides, respectively. Further, the area of the excitation electrode 32 on the rear side is larger than that of the excitation electrode 31 on the front surface side, and the entire region of the excitation electrode 31 is positioned within the excitation electrode 32 in the plan view of the vibration element 1.

The pad electrode 33 is formed in the mounting section 29 of the front surface of the thick section main body 232. On the other hand, the pad electrode 34 is formed to be opposite to the pad electrode 33 on the rear surface of the thick section main body 232.

The extraction electrode 35 extends from the excitation electrode 31, and the excitation electrode 31 and the pad electrode 33 are electrically connected to each other through the extraction electrode 35. Further, the extraction electrode 36 extends from the excitation electrode 32, and the excitation electrode 32 and the pad electrode 34 are electrically connected to each other through the extraction electrode 36. The extraction electrode 36 is provided not to overlap the extraction electrode 35 through the piezoelectric substrate 2 in the plan view. Thus, it is possible to suppress an electrostatic capacitance between the extraction electrodes 35 and 36.

A configuration of the electrode 3 is not particularly limited, but for example, a metal coating obtained by layering Au (gold), Al (aluminum) and an alloy in which Au (gold) or Al (aluminum) is a main component on a base layer made of Cr (chrome), Ni (nickel) or the like may be used.

Hereinbefore, a basic configuration of the vibration element 1 is described. Next, a thickness T of the thick section 22, a width $W_{24}$ of the second thick section 24 and a width $W_{25}$ of the third thick section 25 in the vibration element 1 will be described in detail. Here, the thickness T represents an average thickness of the thick section main bodies 232, 242 and 252 of the thick section 22 (a thickness obtained by (Tmax+Tmin)/2 when a maximum thickness in the Y' axis direction is Tmax and a minimum thickness in the Y' axis direction is Tmin). The width $W_{24}$ represents an average value of the thick section main body 242 (an average value obtained from a maximum size and a minimum size in the X axis direction). The width $W_{25}$ represents an average value of the thick section main body 252 (an average value obtained by (Lmax+Lmin)/2 when a maximum size in the Z' axis direction is Lmax and a minimum size in the Z' axis direction is Lmin). The respective values of the thickness T, the width $W_{24}$ and the width $W_{25}$, to be described below, are values that are particularly effective when the appearance (length L and width W) of the vibration element 1 is within a predetermined range. The predetermined range is a range that satisfies the relationship of L≤5 mm and the relationship of W≤3 mm.

First, the width $W_{24}$ of the thick section main body 242 will be described. The width $W_{24}$ is set to 100 μm or smaller. Thus, it is possible to sufficiently reduce the mass of the second thick section 24, to reduce the mass of the vibration element 1 on the tip side. Thus, as shown in FIG. 4, in a state where the vibration element 1 is fixed to the target through the adhesive material in the mounting section 29, it is possible to reduce the amount of deformation of the vibration element 1 on the tip side (vibrating section 21) when an angular velocity in the Y' axis direction is applied to the vibration element 1. As a result, it is possible to reduce change in a vibration characteristic due to an acceleration in the Y' axis direction, and to abate sensitivity of the vibration element 1 to the acceleration in the Y' axis direction. Accordingly, the vibration element 1 can achieve a stable vibration characteristic regardless of whether the acceleration in the Y' axis direction is applied.

Change in a G sensitivity characteristic due to change in the width $W_{24}$ when an acceleration is applied in the Y' axis direction is shown in a graph of FIG. 5. As shown in FIG. 5, it can be understood that a frequency change decreases and sensitivity to the acceleration in the Y' axis direction is abated as the width $W_{24}$ decreases. Further, change in the amount of deformation when acceleration loads of two vibration elements having different widths $W_{24}$ are applied in the −Y' axis direction is shown in FIG. 6. In FIG. 6, the width $W_{24}$ of the vibration element indicated by a solid line is set to be smaller than the width $W_{24}$ of the vibration element indicated by a dashed line, and the vibration element indicated by the solid line has a small amount of deformation. Thus, it can be understood that the sensitivity of the vibration element 1 having the small width $W_{24}$ to the acceleration in the Y' axis direction is abated. FIGS. 5 and 6 are graphs respectively illustrating the tendency of the vibration element 1 as an example, and thus, the vibration element 1 is not limited to the numerical values shown in FIGS. 5 and 6.

Here, from the viewpoint of the mass reducing effect of the tip section of the vibration element 1, the small width $W_{24}$ is preferable. However, if the width $W_{24}$ is excessively small, the strength of the vibration element 1 may be excessively reduced according to the thickness T of the thick section 22, which may cause damage of the vibration element 1. Thus, from the viewpoint of securing a mechanical strength of the vibration element 1, it is preferable that the width $W_{24}$ be 40 μm or greater. That is, by satisfying the relationship of 40 μm≤$W_{24}$≤100 μm, it is possible to reduce the mass of the tip section of the vibration element 1 while securing the mechanical strength of the vibration element 1. Thus, it is possible to decrease the amount of deformation of the vibration element 1 on the tip side when an angular velocity in the Y' axis direction is applied to the vibration element 1, and thus, the vibration element 1 can achieve a stable vibration characteristic regardless of whether the acceleration in the Y' axis direction is applied. Further, by satisfying the relationship of 45 μm≤$W_{24}$≤55 μm, it is possible to remarkably achieve the above-described effects.

Next, the thickness T of the thick section 22 will be described. The thickness T is not particularly limited, but it is preferable to satisfy the relationship of 50 μm≤T≤70 μm. Thus, it is possible to form the vibrating section 21 with high accuracy while securing the rigidity of the vibration element 1. Thus, the vibration element 1 can stably achieve a desired vibration characteristic. On the other hand, if the thickness T is smaller than the lower limit value, the rigidity of the vibration element 1 may become insufficient according to the mass (the length L, the width W and the like) of the vibration element 1, and thus, it may be difficult to sufficiently reduce the amount of deformation of the tip section (vibrating section 21) of the vibration element 1 when the angular velocity in the Y' axis direction is applied to the vibration element 1. In contrast, if the thickness T exceeds the upper limit value, the size of the vibration element 1 may excessively become large, or the yield of the vibration element 1 may be reduced. Specifically, as described above, the vibrating section 21 is obtained by forming the recessed section on the main surface on the +Y' side by wet etching. Here, if the thickness T increases, the recessed section becomes deep. Accordingly, the widths of the inclined sections 231, 241 and 251 increase. Thus, the size of the vibration element 1 increases. Further, if the thickness T increases, the depth (etching depth) of the recessed section becomes deep, which degrades the etching accuracy. Thus, it is difficult to adjust the vibrating section 21 to a desired thickness, and thus, the yield of the vibration element is reduced.

The change in the G sensitivity characteristic due to the change in the thickness T when the acceleration in the Y' axis direction is applied is shown in a graph of FIG. 7. As shown in FIG. 7, it can be understood that the frequency change decreases and the sensitivity to the acceleration in the Y' axis direction is abated as the thickness T increases. FIG. 7 shows results about four samples. Further, FIG. 7 is a graph illustrating the tendency of the vibration element 1 as an example, and thus, the vibration element 1 is not limited to the numerical values shown in FIG. 7.

Next, the width $W_{25}$ of the thick section main body 252 will be described. The width $W_{25}$ is not particularly limited, but is preferably is set to 200 μm or greater. Thus, it is possible to sufficiently secure the rigidity of the vibration element 1, and to reduce the amount of deformation of the vibration element 1 on the tip side (vibrating section 21) when an angular velocity in the Y' axis direction is applied to the vibration element 1. Accordingly, the vibration element 1 can achieve a stable vibration characteristic regardless of whether the acceleration in the Y' axis direction is applied. In particular, in the vibration element 1, since the first thick section 23 supports the vibrating section 21 in the X axis direction and the third thick section 25 supports the vibrating section 21 in the Z' axis direction, it is possible to effectively suppress the deformation of the vibrating section 21 in the Y' axis direction. The upper limit value of the width $W_{25}$ is not particularly limited, but as long as the vibrating section 21 can be formed with a desired size, it is preferable that the upper limit be large. Thus, it is possible to remarkably achieve the above-described effects.

Change in the G sensitivity characteristic due to change in the width $W_{25}$ when an acceleration is applied in the Y' axis direction is shown in a graph of FIG. 8. As shown in FIG. 8, it can be understood that the frequency change decreases and the sensitivity to the acceleration in the Y' axis direction is abated as the width $W_{25}$ increases. FIG. 8 is a graph illustrating the tendency of the vibration element 1 as an example, and thus, the vibration element 1 is not limited to the numerical values shown in FIG. 8.

As described above, according to the vibration element 1 of the present embodiment, it is possible to reduce the mass on the tip side, and to reduce the change in the vibration characteristic due to the acceleration applied in the Y' axis direction, thereby achieving a stable vibration characteristic.

Figure 9A:
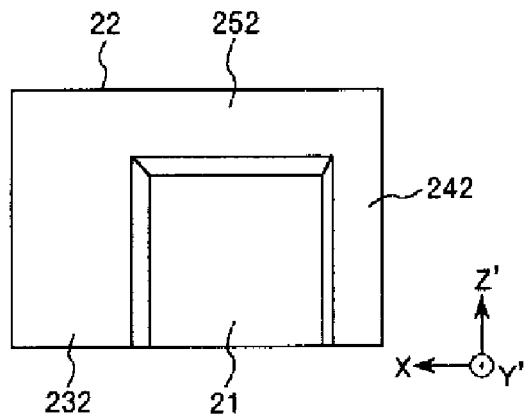
FIGS. 9A to 9E are diagrams illustrating patterns for reducing the mass of a tip section of the vibration element.
Figure 9B:
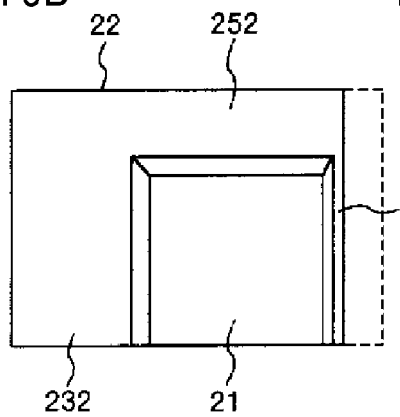
Figure 9D:
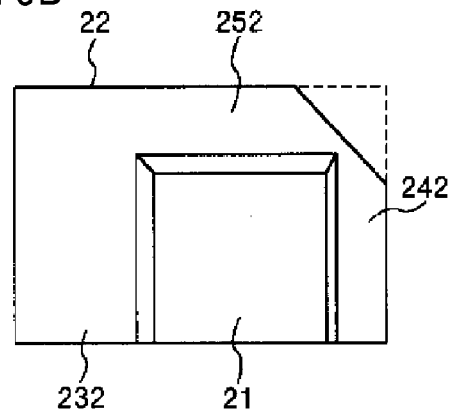
Figure 9C:
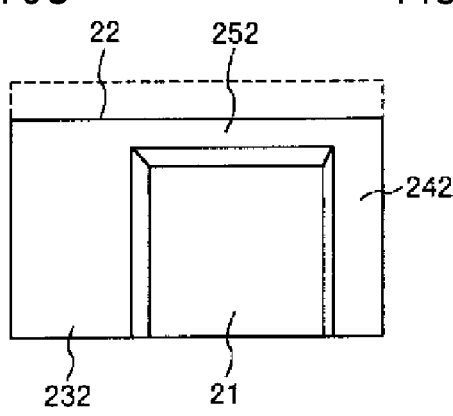
Figure 9E:
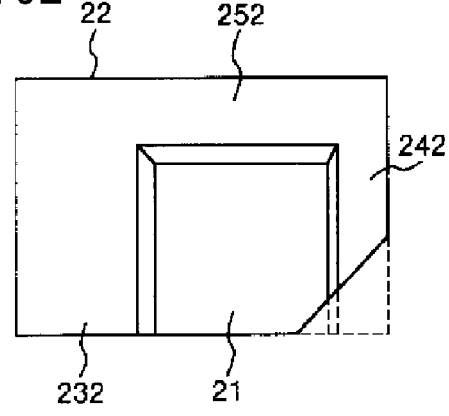

Here, in order to reduce the mass of the tip section of the vibration element shown in FIG. 9A, as shown in FIG. 9B, the width of the thick section main body 242 may be reduced, as shown in FIG. 9C, the width of the thick section main body 252 may be reduced, as shown in FIG. 9D, a corner section of the tip section on the +Z' axis side may be removed, or as shown in FIG. 9E, a corner of the tip section on the –Z' axis side may be removed. Hereinafter, a pattern shown in FIG. 9B is referred to as a pattern P1, a pattern shown in FIG. 9C is referred to as a pattern P2, a pattern shown in FIG. 9D is referred to as a pattern P3, and a pattern shown in FIG. 9E is referred to as a pattern P4.

Influences of the respective patterns P1 to P4 on the G sensitivity characteristic are shown in FIG. 10. The horizontal axis in the graph of FIG. 10 represents a value of [mass of a removed section (section surrounded by a dashed line)]× [separation distance between the center of gravity of the removed section and a fulcrum (mounting section 29)], which is referred to as a "moment" hereinafter. The vertical axis in the graph of FIG. 10 represents a standardized G sensitivity, which is a value obtained by standardizing a G sensitivity of each of the patterns P1 to P4 when the G sensitivity of the vibration element shown in FIG. 9A is set to "1".

It can be understood from FIG. 10 that changes in the G sensitivity characteristics are different in the patterns P1 to P4. For example, the G sensitivity decreases as the removed section is enlarged in the patterns P1, P3 and P4, whereas the G sensitivity increases as the removed section is enlarged in the pattern P2. Further, in the patterns P1, P3 and P4, the G sensitivity linearly decreases in proportional to the size of the removed section without being saturated in the patterns P1 and P3, whereas the decrease of the G sensitivity is almost saturated if the size of the removed section is a predetermined value or greater in the pattern P4. It is considered that the difference between the G sensitivity characteristic changes of the patterns P1 to P4 is caused due to the crystal axes of the quartz crystal and the shape of the vibration element.

FIG. 11 is a graph illustrating the relationship of a resonance frequency due to a force F applied to a quartz crystal vibrator and displacement. When an intersection angle between the force F and the X axis of the quartz crystal is $\psi$, if $\psi=0°$, the force F acts along the X axis direction, and if $\psi=90°$, the force F acts along the Z' axis direction.

Further, it can be understood from FIG. 11 that a stress sensitivity (Kf) is reversed in positivity and negativity between the X axis and the Z' axis. It is considered that this reversion is a factor that causes the difference between the pattern P1 and the pattern P2. Further, since it is considered that each of the patterns P3 and P4 is a combination of the patterns p1 and P2, it is considered that the patterns P3 and P4 show different characteristics from those of the patterns P1 and P2. Further, it is considered that the difference between the patterns P3 and P4 is also caused due to the difference between the shapes of the vibration element 1, in addition to the stress sensitivity. That is, in the pattern P3, since the thick section 22 occupies the entirety of the removed section regardless of the size of the removed section, the G sensitivity is linearly abated according to the size of the removed section. On the other hand, in the pattern P4, the ratio of the vibrating section 21 occupied by the removed section increases as the removed section is enlarged, the mass reducing effect is reduced, and the decrease of the G sensitivity is saturated.

In this way, the present inventors found that it is possible to select a method of changing the G sensitivity according to how to reduce the mass of the tip section of the vibration element. In the vibration element 1, by selecting the pattern P1 from among the patterns P1 to P4, it is possible to reduce the mass of the tip section and to improve the G sensitivity characteristic. The pattern P1 is preferable in that the G sensitivity reduction can be achieved without saturation. Further, the pattern P1 is also effective in that it is possible to reduce the length of the vibrating element 1 in the X axis direction and to reduce the size, compared with the other patterns P2 to P4. Further, as described above, by increasing the width $W_{25}$, it is possible to suppress the occurrence of the effect of the pattern P2, and to suppress the increase in the G sensitivity.

Second Embodiment

Next, a second embodiment of a vibration element of the invention will be described.

Figure 12:
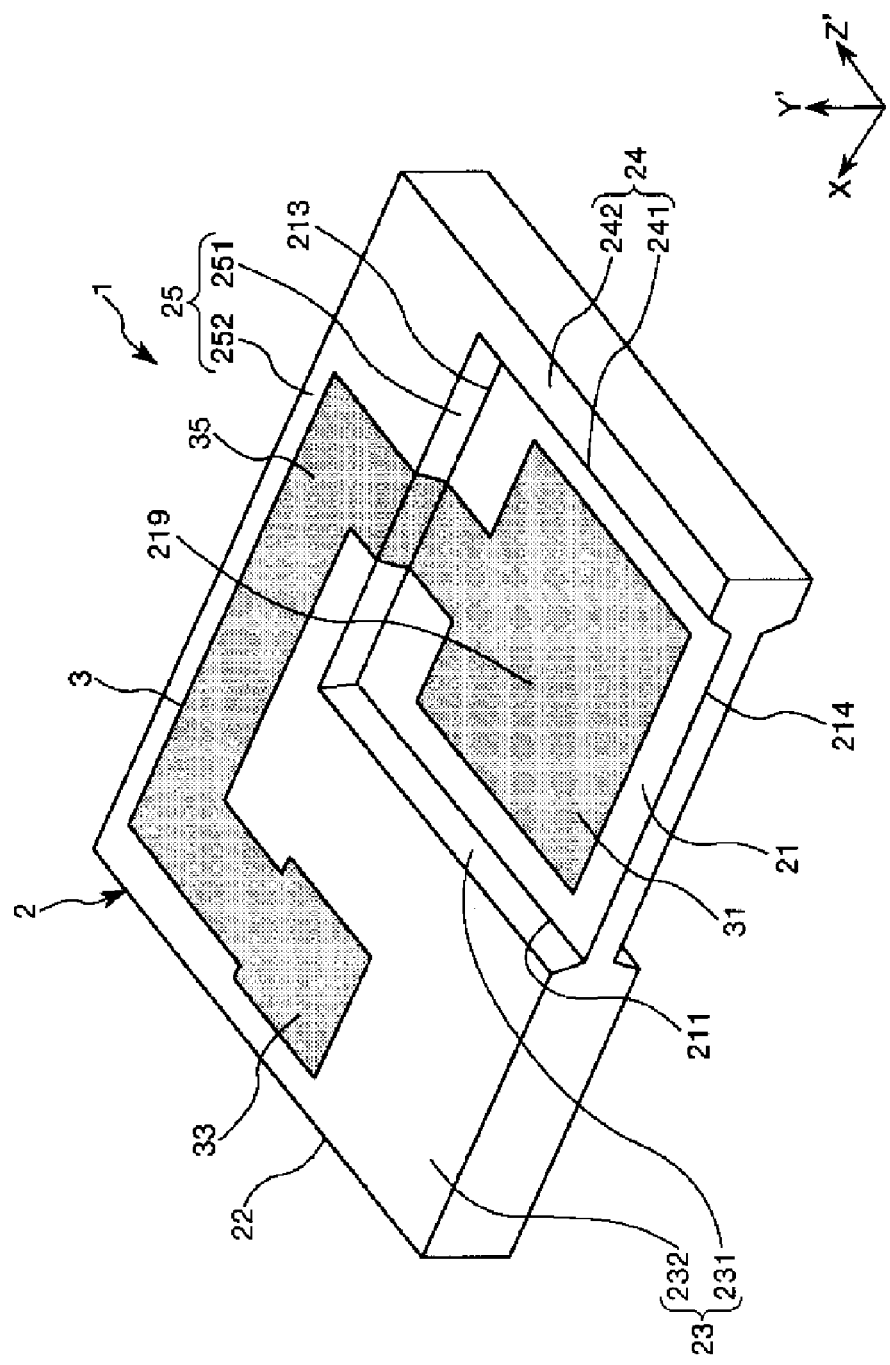
FIG. 12 is a perspective view illustrating a vibration element according to a second embodiment of the invention.

FIG. 12 is a perspective view of the vibration element according to the second embodiment of the invention.

Hereinafter, differences between the vibration element of the second embodiment and the vibration element of the first embodiment will be mainly described, and description about the same content will not be repeated.

The vibration element according to the second embodiment of the invention is the same as that of the first embodiment, except for the configuration of the piezoelectric substrate. The same components as in the first embodiment are given the same reference numerals.

As shown in FIG. 12, in the vibration element 1 of the present embodiment, by forming recessed sections on the both main surfaces of the piezoelectric substrate 2, the vibrating section 21 is formed. In other words, the front surface (main surface on the +Y' axis direction side) of the thick section 22 is provided to protrude in the +Y' axis direction with reference to the front surface (main surface on the +Y' axis direction side) of the vibrating section 21, and the rear surface (main surface on the –Y' axis direction side) of the thick section 22 is provided to protrude in the –Y' axis direction with respect to the rear surface (main surface on the –Y' axis direction side) of the vibrating section 21. In this way, by forming the recessed sections on the both main surfaces of the piezoelectric substrate 2 to form the vibrating section 21, for example, it is possible to reduce the etching depth of the recessed sections, compared with the above-described first embodiment. Thus, it is possible to perform the etching with accuracy, and to obtain the outer shape of the piezoelectric substrate 2 with high accuracy.

According to the second embodiment, it is possible to achieve the same effect as in the first embodiment.

2. Vibrator

Next, a vibrator (vibrator according to the invention) to which the above-described vibration element 1 is applied will be described.

Figure 13:
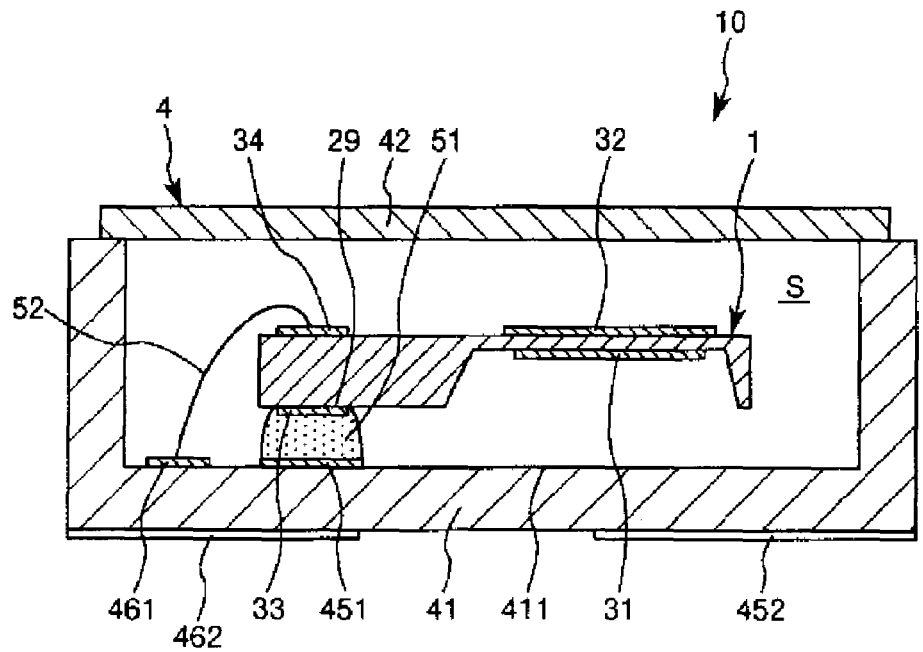
FIG. 13 is a cross-sectional view illustrating an embodiment suitable for a vibrator according to the invention.

FIG. 13 is a cross-sectional view illustrating an embodiment suitable for the vibrator according to the invention.

A vibrator 10 shown in FIG. 13 includes the above-described vibration element 1, and a package 4 that accommodates the vibration element 1.

Package

The package 4 includes a base 41 of a box shape having a recessed section 411 with an opening at an upper surface thereof, and a lid 42 of a plate shape bonded to the base 41 to block the opening of the recessed section 411. Further, the vibration element 1 is accommodated in an accommodating space S formed as the recessed section 411 is blocked by the lid 42. The accommodating space S may be in a decompression (vacuum) state, or may be sealed with an inert gas such as nitrogen, helium or argon.

A component material of the base 41 is not particularly limited, but various ceramics such as aluminum oxide may be used. Further, a component material of the lid 42 is not particularly limited, but a member having a linear expansion coefficient close to that of the component material of the base 41 may be used. For example, when the component material of the base 41 is the above-described ceramics, an alloy such as Kovar may be preferably used. The bonding of the base 41 and the lid 42 is not particularly limited, but for example, may be performed using an adhesive material, or may be performed using seam welding or the like.

On the bottom surface of the recessed section 411 of the base 41, connection electrodes 451 and 461 are formed. Further, on the lower surface of the base 41, outer mounting terminals 452 and 462 are formed. The connection electrode 451 is electrically connected to the outer mounting terminal 452 through a through electrode (not shown) formed in the base 41, and the connection electrode 461 is electrically connected to the outer mounting terminal 462 through a through electrode (not shown) formed in the base 41.

Configurations of the connection electrodes 451 and 461 and the outer mounting terminals 452 and 462 are not particularly limited as long as they have conductivity, respectively. For example, the connection electrodes 451 and 461 and the outer mounting terminals 452 and 462 may be formed by a metal coating obtained by layering a coating made of Ni (nickel), Au (gold), Ag (silver), Cu (copper) or the like on a metalized layer (base layer) made of Cr (chrome), W (tungsten) or the like.

The vibration element 1 accommodated in the accommodating space S is fixed to the base 41 by a conductive adhesive material 51 in the mounting section 29 with the front surface thereof being directed toward the base 41. The conductive adhesive material 51 is provided in contact with the connection electrode 451 and the pad electrode 33. Thus, the connection electrode 451 and the pad electrode 33 are electrically connected to each other through the conductive adhesive material 51. By supporting the vibration element 1 at one place (one point) using the conductive adhesive material 51, for example, it is possible to suppress stress generated by the vibration element 1 due to the difference between the thermal expansion coefficients of the base 41 and the piezoelectric substrate 2.

The conductive adhesive material 51 is not particularly limited as long as it has conductivity and adhesiveness, but for example, a material obtained by dispersing a conductive filler into an adhesive material of a silicone base, an epoxy base, an acrylic base, a polyimide base, a bismaleimide base or the like may be used.

The pad electrode 34 of the vibration element 1 is electrically connected to the connection electrode 461 through a bonding wire 52. As described above, since the pad electrode 34 is disposed to face the pad electrode 33, in a state where the vibration element 1 is fixed to the base 41, the pad electrode 34 is disposed directly above the conductive adhesive material 51. Thus, it is possible to suppress leakage of vibration (ultrasonic vibration) given to the pad electrode 34 in wire bonding, and to reliably perform the connection of the bonding wire 52 to the pad electrode 34.

3. Oscillator

Next, an oscillator (oscillator according to the invention) to which the vibration element according to the invention is applied will be described.

Figure 14:
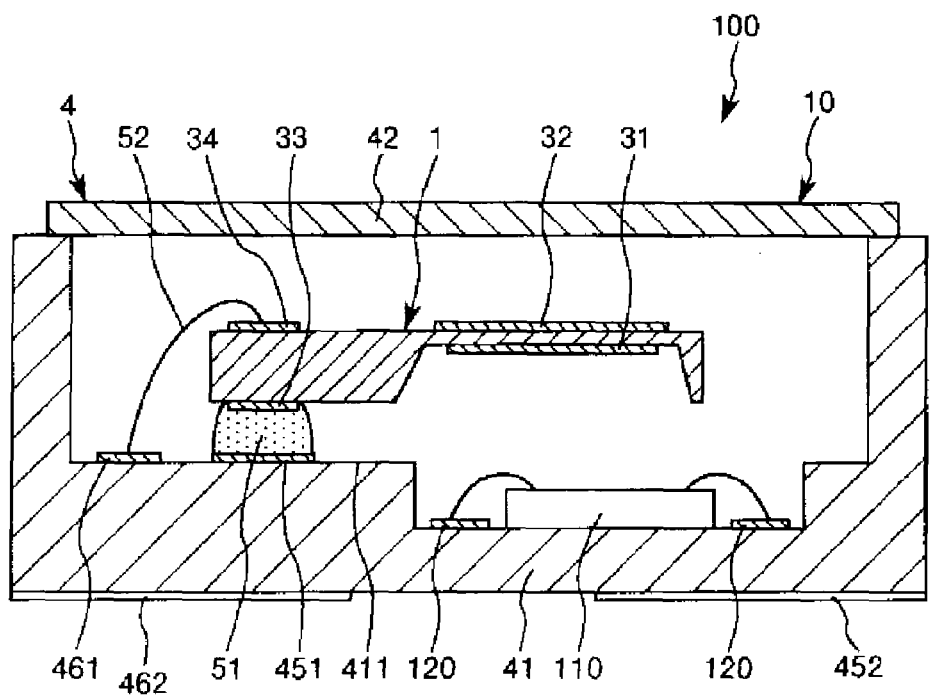
FIG. 14 is a cross-sectional view illustrating an embodiment suitable for an oscillator according to the invention.

FIG. 14 is a cross-sectional view illustrating an embodiment suitable for the oscillator according to the invention.

An oscillator 100 shown in FIG. 14 includes the vibrator 10, and an IC chip 110 for driving the vibration element 1. Hereinafter, differences between the oscillator 100 and the above-described vibrator will be mainly described, and description about the same content will not be repeated.

As shown in FIG. 14, in the oscillator 100, the IC chip 110 is fixed to the recessed section 411 of the base 41. The IC chip 110 is electrically connected to plural internal terminals 120 formed on the bottom surface of the recessed section 411. A part of the plural internal terminals 120 are connected to the connection electrodes 451 and 461, and the remaining part thereof are connected to the external mounting terminals 452 and 462. The IC chip 110 has an oscillation circuit for performing a drive control of the vibration element 1. If the vibration element 1 is driven by the IC chip 110, it is possible to extract a signal of a predetermined frequency.

4. Electronic Apparatus

Next, an electronic apparatus (electronic apparatus according to the invention) to which the vibration element according to the invention is applied will be described.

Figure 15:
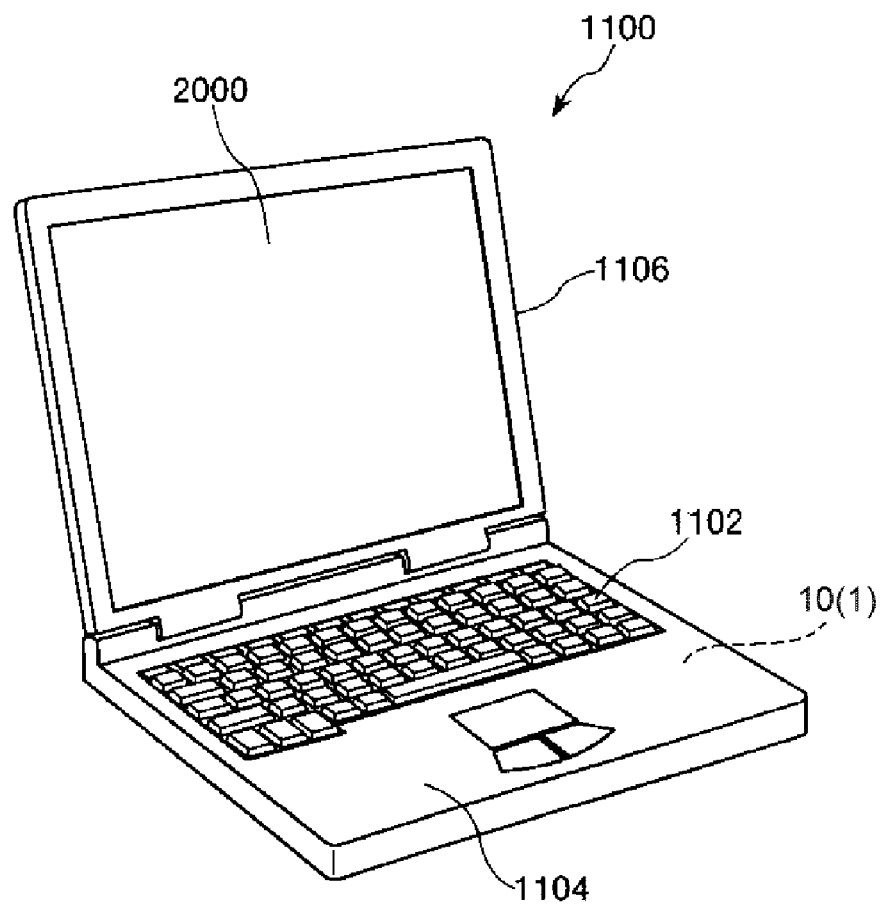
FIG. 15 is a perspective view illustrating a configuration of a mobile (or note-type) personal computer to which an electronic apparatus according to the invention is applied.

FIG. 15 is a perspective view illustrating a configuration of a mobile (or note-type) personal computer to which the electronic apparatus according to the invention is applied. In FIG. 15, a personal computer 1100 includes a main body section 1104 provided with a keyboard 1102, and a display unit 1106 provided with a display section 2000. The display unit 1106 is supported to the main body section 1104 to be rotatable through a hinge structure. The vibrator 10 (vibration element 1) that functions as a filter, a resonator, a reference clock or the like is built in the personal computer 1100.

Figure 16:
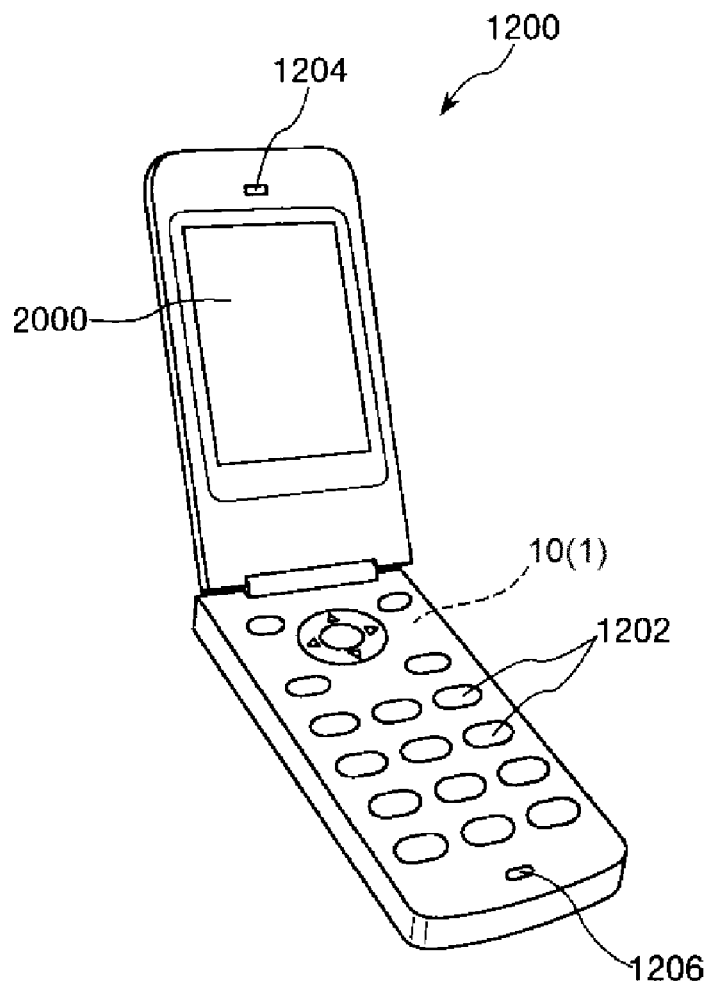
FIG. 16 is a perspective view illustrating a configuration of a mobile phone (including a PHS) to which an electronic apparatus according to the invention is applied.

FIG. 16 is a perspective view illustrating a configuration of a mobile phone (including a PHS) to which the electronic apparatus according to the invention is applied. In FIG. 16, a mobile phone 1200 includes plural operation buttons 1202, an ear piece 1204 and a mouthpiece 1206, and a display section 2000 is disposed between the operation buttons 1202 and the ear piece 1204. The vibrator 10 (vibration element 1) that functions as a filter, a resonator or the like is built in the mobile phone 1200.

Figure 17:
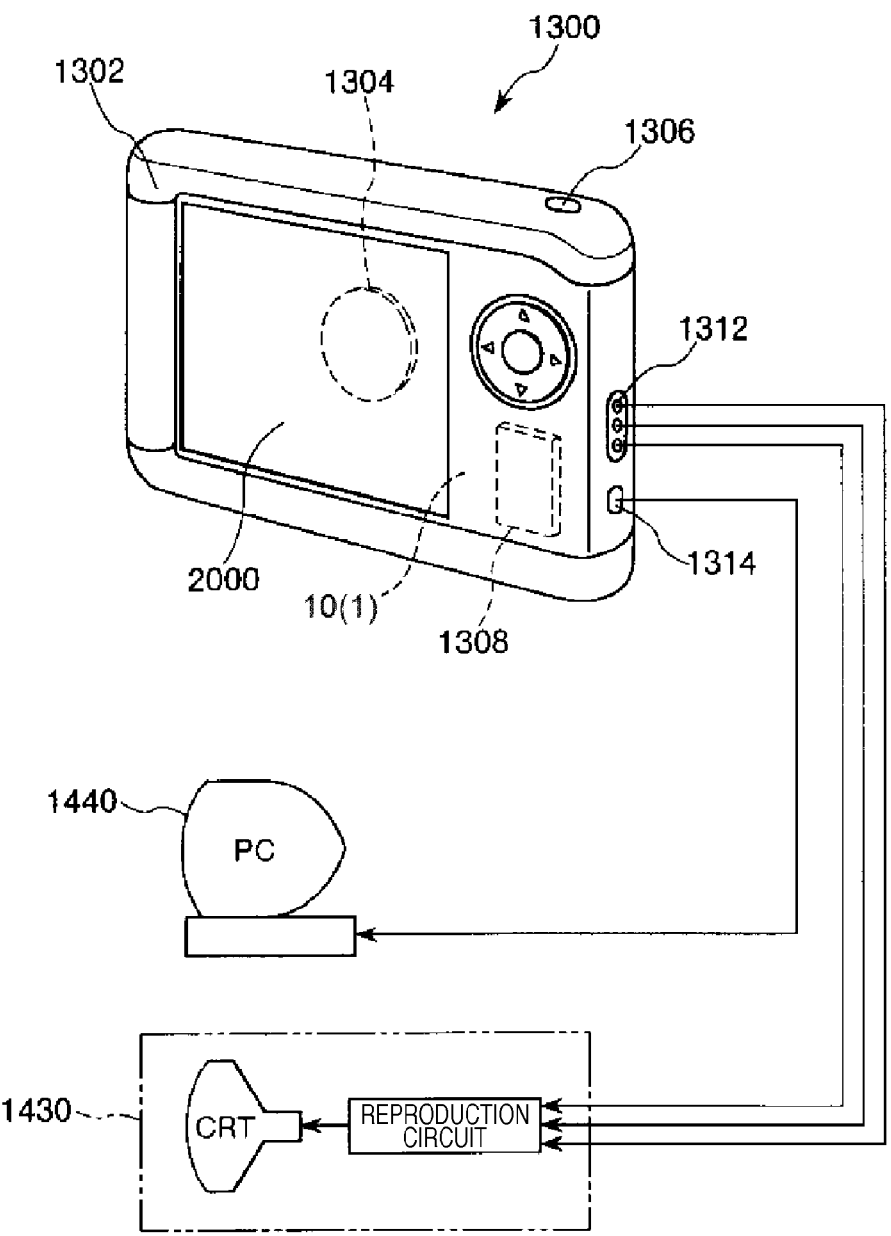
FIG. 17 is a perspective view illustrating a configuration of a digital still camera to which an electronic apparatus according to the invention is applied.

FIG. 17 is a perspective view illustrating a configuration of a digital still camera to which the electronic apparatus according to the invention is applied. In FIG. 17, connection to an external device is also simply shown. Here, an ordinary camera has a configuration in which a silver salt photo film is exposed to a light image of an object, whereas a digital still camera 1300 has a configuration in which a light image of an object is photoelectrically converted by an imaging element such as a charged coupled device (CCD) to generate an imaging signal (image signal).

A display section is provided on a rear surface of a case (body) 1302 in the digital still camera 1300 to perform display based on the imaging signal obtained by the CCD. The display section functions as a finder that displays the object as an electronic image. Further, a light receiving unit 1304 that includes an optical lens (imaging optical system), a CCD or the like is provided on a front surface side (rear surface side in the figure) of the case 1302.

If a user checks an object image displayed in the display section and presses a shutter button 1306, an imaging signal of the CCD at that time is transmitted to and stored in a memory 1308. Further, in the digital still camera 1300, a video signal output terminal 1312, and a data communication input/output terminal 1314 are provided on a side surface of the case 1302. Further, as shown in the figure, a television monitor 1430 is connected to the video signal output terminal 1312, and a personal computer 1440 is connected to the data communication input/output terminal 1314, as necessary. Further, the imaging signal stored in the memory 1308 is output to the television monitor 1430 or the personal computer 1440 by a predetermined operation. The vibrator 10 (vibration element 1) that functions as a filter, a resonator or the like is built in the digital still camera 1300.

The electronic apparatus provided with the vibration element according to the invention may be applied to an ink jet discharge device (for example, an ink jet printer), a laptop personal computer, a television, a video camera, a video tape recorder, a car navigation device, a pager, an electronic organizer (including the one which has a communication function), an electronic dictionary, a calculator, an electronic game machine, a word processor, a work station, a television phone, a crime prevention TV monitor, electronic binoculars, a POS terminal, a medical device (for example, an electronic thermometer, a blood manometer, a blood sugar level meter, an electrocardiographic measuring device, an ultrasonic diagnostic device or an electronic endoscope), a fish-finder, a variety of measuring devices, a meter (for example, a meter for a vehicle, an airplane or a ship), a flight simulator or the like, for example, in addition to the personal computer (mobile personal computer) shown in FIG. 15, the mobile phone shown in FIG. 16 and the digital still camera shown in FIG. 17.

5. Moving Object

Next, a moving object (moving object according to the invention) to which the vibration element according to the invention is applied will be described.

Figure 18:
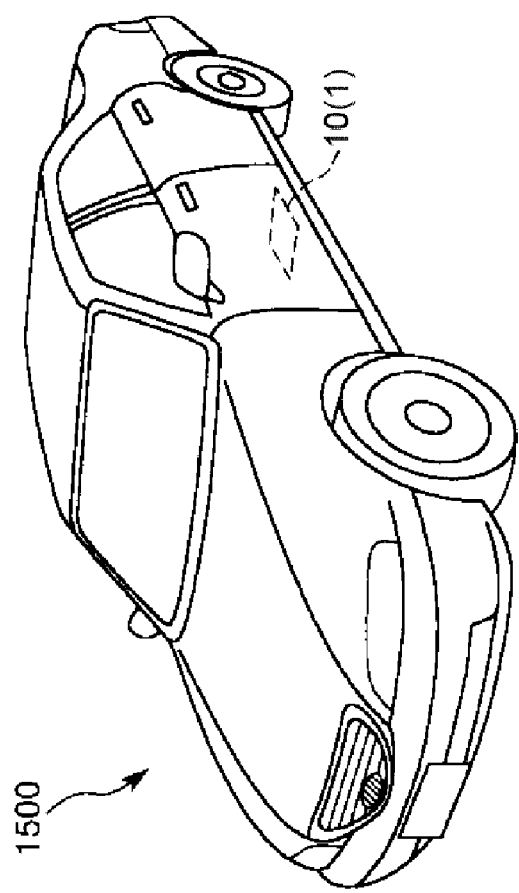
FIG. 18 is a perspective view schematically illustrating an automobile that is an example of a moving object according to the invention.

FIG. 18 is a perspective view schematically illustrating an automobile that is an example of the moving object according to the invention. The vibrator 10 (vibration element 1) is mounted on an automobile 1500. The vibrator 10 may be widely applied to an electronic control unit (ECU) such as a keyless entry, an immobilizer, a car navigation system, a car air-conditioner, an anti-lock braking system (ABS), an air bag, a tire pressure monitoring system (TPMS), an engine controller, a battery monitor of a hybrid automobile or an electric car, or a vehicle attitude control system.

Hereinbefore, the vibration element, the vibrator, the oscillator, the electronic apparatus and the moving object according to the invention have been described with reference to the embodiments shown in the drawings, but the invention is not limited thereto. The configurations of the respective sections may be replaced with arbitrary configurations having the same functions. Further, other arbitrary configurations may be added to the invention. Further, the above-described embodiments may be appropriately combined.

Further, in the above-described embodiments, the quartz crystal substrate is used as the piezoelectric substrate, but for example, various piezoelectric substrates made of lithium niobate, lithium tantalite or the like may be used instead of the quartz crystal substrate.

The entire disclosure of Japanese Patent Application No. 2013-075013, filed Mar. 29, 2013 is expressly incorporated by reference herein.

What is claimed is:

1. A vibration element comprising:
   a substrate that includes a first region having a vibration region that vibrates with a thickness shear vibration, and a second region that is integrated with a pheriphery of the first region and has a thickness larger than that of the first region, the substrate having a length along a first direction and a width along a second direction perpendicular to the first direction in a plan view,
   wherein the periphery of the first region includes
   a first outer edge and a second outer edge that are respectively provided in the second direction, and
   a third outer edge and a fourth outer edge that are respectively provided in the first direction,
   wherein the second region includes
   a first thick section that is provided along the first outer edge, the first thick section having a mounting section that is fixed to a package base,
   a second thick section that is provided along the second outer edge, and
   a third thick section that is provided along the third outer edge, and
   wherein when the length of the substrate along the first direction is L and the width of the substrate along the second direction is W, L and W are satisfied by the following formulas:

$L \leq 5$ mm; and $W \leq 3$ mm, wherein when a maximum size of the second thick section along the first direction is L2max and a minimum size thereof is L2min, a first average size expressed by (L2max+L2min)/2 is 40 μm or greater and 100 μm or smaller, and
   wherein when a maximum size of the third thick section along the second direction is L3max and a minimum size thereof is L3min, a second average size expressed by (L3max+L3min)/2 is equal to or more than 200 μm.

2. The vibration element according to claim 1,
   wherein the first average size is 45 μm or greater and 55 μm or smaller.

3. The vibration element according to claim 2,
   wherein when a maximum thickness of the second region is Tmax and a minimum thickness thereof is Tmin, an average thickness expressed by (Tmax+Tmin)/2 is 50 μm or greater and 70 μm or smaller.

4. The vibration element according to claim 2, wherein the first direction is along a vibration direction of the thickness shear vibration of the vibration region.

5. The vibration element according to claim 2,
   wherein when an electrical axis, a mechanical axis and an optical axis that are crystal axis of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate is a quartz crystal plate in which a surface including the X axis and the Z' axis corresponds to a main surface and a direction of the Y' axis corresponds to a thickness, and the first direction is along the X axis.

6. The vibration element according to claim 1, wherein when a maximum thickness of the second region is Tmax and a minimum thickness thereof is Tmin, an average thickness expressed by (Tmax+Tmin)/2 is 50 µm or greater and 70 µm or smaller.

7. The vibration element according to claim 1, wherein when an electrical axis, a mechanical axis and an optical axis that are crystal axis of a quartz crystal are respectively represented as an X axis, a Y axis and a Z axis, and when an axis obtained by inclining the Z axis so that a +Z side is rotated in a −Y direction of the Y axis is represented as a Z' axis and an axis obtained by inclining the Y axis so that a +Y side is rotated in a +Z direction of the Z axis is represented as a Y' axis, using the X axis as a rotation axis, the substrate is a quartz crystal plate in which a surface including the X axis and the Z' axis corresponds to a main surface and a direction of the Y' axis corresponds to a thickness, and the first direction is along the X axis.

8. A vibrator comprising:
the vibration element according to claim 1; and
a package in which the vibration element is accommodated.

9. An oscillator comprising:
the vibration element according to claim 1; and
an oscillation circuit that drives the vibration element.

10. An electronic apparatus comprising the vibration element according to claim 1.

11. A moving object comprising the vibration element according to claim 1.

12. The vibration element according to claim 1, wherein
the first region has first and second surfaces opposite to each other,
the first thick section has third and fourth surfaces opposite to each other,
the second thick section has fifth and sixth surfaces opposite to each other,
the third thick section has seventh and eighth surfaces opposite to each other,
the third surface of the first thick section is projected more than the first surface of the first region, and the fourth surface of the first thick section and the second surface of the first region are even,
the fifth surface of the second thick section is projected more than the first surface of the first region, and the sixth surface of the second thick section and the second surface of the first region are even, and
the seventh surface of the third thick section is projected more than the first surface of the first region, and the eighth surface of the third thick section and the second surface of the first region are even.

13. The vibration element according to claim 1, wherein
the first region has first and second surfaces opposite to each other,
the first thick section has third and fourth surfaces opposite to each other,
the second thick section has fifth and sixth surfaces opposite to each other,
the third thick section has seventh and eighth surfaces opposite to each other,
the third surface of the first thick section is projected more than the first surface of the first region, and the fourth surface of the first thick section is projected more than the second surface of the first region,
the fifth surface of the second thick section is projected more than the first surface of the first region, and the sixth surface of the second thick section is projected more than the second surface of the first region, and
the seventh surface of the third thick section is projected more than the first surface of the first region, and the eighth surface of the third thick section is projected more than the second surface of the first region.

14. The vibration element according to claim 1, wherein
the first direction is along a vibration direction of the thickness shear vibration of the vibration region.

* * * * *